United States Patent
Uesugi et al.

(10) Patent No.: US 9,337,267 B2
(45) Date of Patent: May 10, 2016

(54) SEMICONDUCTOR DEVICE

(71) Applicant: KABUSHIKI KAISHA TOYOTA CHUO KENKYUSHO, Nagakute-shi, Aichi-ken (JP)

(72) Inventors: Tsutomu Uesugi, Nagakute (JP); Tetsu Kachi, Nagakute (JP); Daigo Kikuta, Nagakute (JP); Tetsuo Narita, Nagakute (JP)

(73) Assignee: KABUSHIKI KAISHA TOYOTA CHUO KENKYUSHO, Nagakute-shi (JP)

( * ) Notice: Subject to any disclaimer, the term of this patent is extended or adjusted under 35 U.S.C. 154(b) by 0 days.

(21) Appl. No.: 14/601,776

(22) Filed: Jan. 21, 2015

(65) Prior Publication Data

US 2015/0221759 A1    Aug. 6, 2015

(30) Foreign Application Priority Data

Feb. 6, 2014   (JP) ................. 2014-021142

(51) Int. Cl.
| | |
|---|---|
| H01L 29/00 | (2006.01) |
| H01L 29/08 | (2006.01) |
| H01L 29/417 | (2006.01) |
| H01L 29/778 | (2006.01) |
| H01L 29/20 | (2006.01) |
| H01L 29/423 | (2006.01) |

(52) U.S. Cl.
CPC ...... H01L 29/0847 (2013.01); H01L 29/41775 (2013.01); H01L 29/7786 (2013.01); *H01L 29/2003* (2013.01); *H01L 29/4236* (2013.01); *H01L 29/42356* (2013.01)

(58) Field of Classification Search
CPC .............. H01L 29/7787; H01L 29/205; H01L 29/4236; H01L 29/2003; H01L 29/0847; H01L 29/7786; H01L 29/41775; H01L 29/4235

See application file for complete search history.

(56) References Cited

U.S. PATENT DOCUMENTS

| | | | |
|---|---|---|---|
| 8,519,438 B2* | 8/2013 | Mishra et al. ................. | 257/192 |
| 2008/0142845 A1* | 6/2008 | Kodama et al. ............... | 257/194 |
| 2009/0267078 A1* | 10/2009 | Mishra et al. .................. | 257/76 |
| 2010/0230717 A1 | 9/2010 | Saito | |

FOREIGN PATENT DOCUMENTS

| | | |
|---|---|---|
| JP | 2007-096203 A | 4/2007 |
| JP | 2008-147593 A | 6/2008 |
| JP | 2010-045073 A | 2/2010 |
| JP | 2010-219117 A | 9/2010 |
| JP | 2012-231108 A | 11/2012 |

OTHER PUBLICATIONS

Dec. 15, 2015 Office Action issued in Japanese Application No. 2014-021142.

* cited by examiner

*Primary Examiner* — Nikolay Yushin
(74) *Attorney, Agent, or Firm* — Oliff PLC

(57) ABSTRACT

A semiconductor device is provided with an electronic transit layer, an electron supply layer, a source region, a drain electrode, a source electrode and an insulated gate. In a region between the drain electrode and the insulated gate, a two-dimensional electron gas layer is configured to be generated at a hetero junction between the electronic transit layer and the electron supply layer. A part of the insulated gate is configured to face to the source region.

3 Claims, 4 Drawing Sheets

SEMICONDUCTOR DEVICE

CROSS-REFERENCE TO RELATED APPLICATION

This application claims priority to Japanese Patent Application No. 2014-021142 filed on Feb. 6, 2014, the contents of which are hereby incorporated by reference into the present application.

TECHNICAL FIELD

The technique disclosed in the present application relates to a semiconductor device including a hetero junction.

DESCRIPTION OF RELATED ART

A semiconductor device that employs a two-dimensional electron gas layer formed at a hetero junction between an electron transit layer and an electron supply layer having different bandgaps, has been developed. The semiconductor device of this type is provided with a gate between a drain electrode and a source electrode so that the amount of electric current flowing between the drain electrode and the source electrode is controlled depending on voltage applied to the gate. Japanese Patent Application Publication No. 2007-96203 discloses an example of such a semiconductor device.

The conventional semiconductor device of this type includes an equivalent circuit between the drain electrode and the source electrode in which a gate-to-drain impedance element and a gate-to-source impedance element are connected in series. When an excessive noise voltage is input to the drain electrode, the equivalent circuit acts as a voltage-dividing circuit and thus the voltage of the gate electrode, which is at the middle point between the impedance elements connected in series, is increased based on a voltage-division ratio defined by a gate-to-drain impedance and a gate-to-source impedance. For this reason, with regard to the conventional semiconductor device, it has been a problem that a malfunction (called self turn-on) occurs due to the voltage increase of the gate electrode when an excessive noise voltage is input to the drain electrode.

In order to suppress the voltage increase of the gate electrode, it is preferred to lower the gate-to-source impedance. The gate-to-source impedance depends strongly on a gate-to-source parasitic capacitance. Therefore, it suffices to increase the gate-to-source parasitic capacitance for lowering the gate-to-source impedance.

BRIEF SUMMARY OF INVENTION

In the conventional semiconductor device, the gate-to-source parasitic capacitance depends on the width of a depletion layer between the gate electrode and the source electrode. Accordingly, when an excessive noise voltage is input to the drain electrode, the width of the depletion layer between the gate electrode and the source electrode becomes larger such that the gate-to-source parasitic capacitance is decreased. It is thus difficult for the conventional semiconductor device with the gate-to-source parasitic capacitance depending on the depletion layer width to increase the gate-to-source parasitic capacitance. This leads to a difficulty in lowering the gate-to-source impedance by the conventional semiconductor device, making it difficult to effectively suppress the malfunction.

It is an object of the technique disclosed in this specification to provide a semiconductor device in which the malfunction is suppressed.

A semiconductor device disclosed in this specification comprises a semiconductor laminated body, a drain electrode disposed on the semiconductor laminated body, a source electrode disposed on the semiconductor laminated body and located apart from the drain electrode, and an insulated gate disposed on the semiconductor laminated, body and located between the drain electrode and the source electrode. The semiconductor laminated body includes a first semiconductor layer, and a second semiconductor layer disposed on the first semiconductor layer and having a bandgap which is different from a bandgap of the first semiconductor layer. In a region between the drain electrode and the insulated gate, a two-dimensional electron gas layer is configured to be generated at a hetero junction between the first semiconductor layer and the second semiconductor layer. A part of the insulated gate is configured to face a portion which is to be a same potential with the source electrode.

The semiconductor device as above is characterized in that the insulated gate partially faces a portion that is to be the same potential with the source electrode so that the portion forms a capacitor. The gate-to-source parasitic capacitance depends substantially on the capacitance defined by the capacitor and does not depend on the width of the depletion layer between the gate electrode and the source electrode. This enables the semiconductor device of the embodiment to increase the gate-to-source parasitic capacitance and accordingly lower the gate-to-source impedance such that the malfunction is suppressed.

DETAILED DESCRIPTION OF INVENTION

Figure 1:
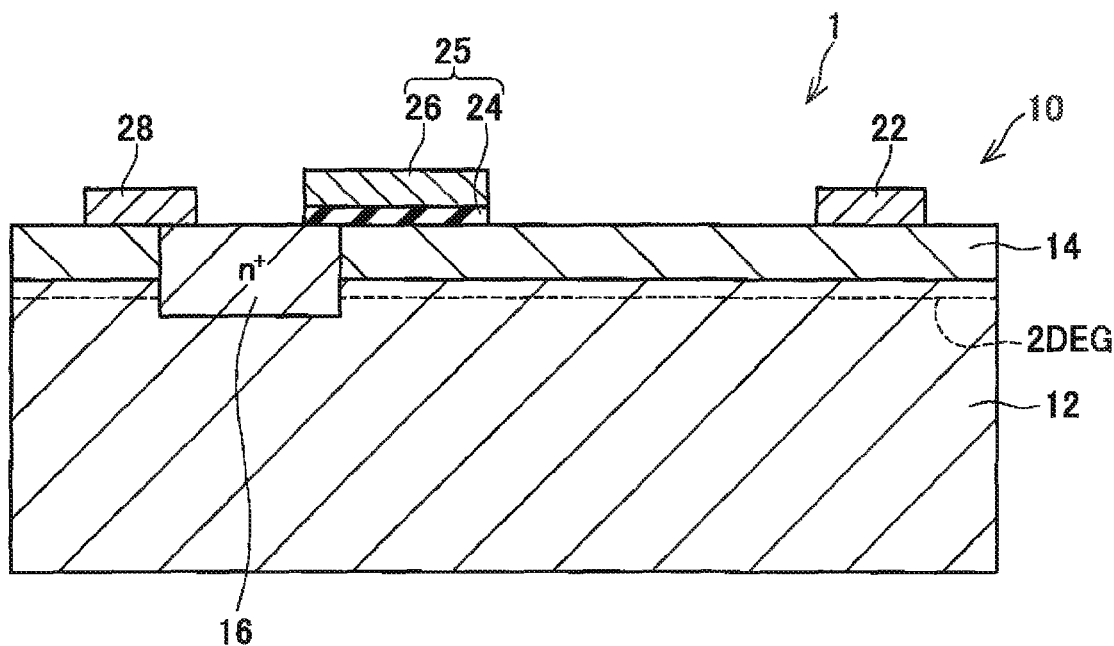
FIG. 1 is a schematic sectional view of an essential part of a semiconductor device according to a first embodiment.

Technical features disclosed in this specification are summarized below. Note that matters described below respectively independently have technical utility.

A semiconductor device disclosed in this specification may comprise a semiconductor laminated body, a drain electrode, a source electrode and an insulated gate. The drain electrode may be disposed on the semiconductor laminated body. The source electrode may be disposed on the semiconductor laminated body and may be located apart from the drain electrode. The insulated gate may be disposed on the semiconductor laminated body and may be located between the drain electrode and the source electrode. The semiconductor laminated body may include a first semiconductor layer and a second semiconductor layer. The second semiconductor layer may be disposed on the first semiconductor layer and may have a bandgap which is different from a bandgap of the first semiconductor layer. In a region between the drain electrode and the insulated gate, the semiconductor device may be configured such that a two-dimensional electron gas layer is generated at a hetero junction between the first semiconductor layer and the second semiconductor layer. Further, the semiconductor device may be configured such that a part of the insulated gate faces a portion which is to be a same potential with the source electrode. The portion which is to be a same potential with the source electrode may be formed by a conducting body or a semiconductor with densely-doped dopants.

A material of the semiconductor laminated body is not limited to a specific one. In general, it is preferable that a nitride compound semiconductor is used as the material of the semiconductor laminated body. For example, it is preferable that the material of the first semiconductor layer is $In_{Xa}Al_{Ya}Ga_{1-Xa-Ya}N$ ($0 \leq Xa \leq 1$, $0 \leq Ya \leq 1$, $0 \leq Xa+Ya \leq 1$), the material of the second semiconductor layer is $In_{Xb}Al_{Yb}Ga_{1-Xb-Yb}N$ ($0 \leq Xb \leq 1$, $0 \leq Yb \leq 1$, $0 \leq Xb+Yb \leq 1$), and the bandgap of $In_{Xb}Al_{Yb}Ga_{1-Xb-Yb}N$ is larger than the bandgap of $In_{Xa}Al_{Ya}Ga_{1-Xa-Ya}N$.

In one embodiment of the semiconductor device disclosed in this specification, the semiconductor laminated body may further include a source region of n-type which is electrically connected to the source electrode. In this case, the portion which is to be the same potential with the source electrode may be at least a part of the source region. The semiconductor device of this embodiment includes a capacitor configured with the insulated gate and the source region. A gate-to-source distance is a thickness of an insulated layer of the insulated gate so that a gate-to-source parasitic capacitance can be increased and a gate-to-source impedance can be decreased.

In one embodiment of the semiconductor device disclosed in this specification, the insulated gate may be of a recess-type. The recess-type insulated gate may penetrate the second semiconductor layer and reach the first semiconductor layer. The semiconductor device including the recess-type insulated gate which reaches the first semiconductor layer can operate in normally-off.

In one embodiment of the semiconductor device disclosed in this specification, the source region may contact with a side surface of the recess-type insulated gate. In this embodiment, a capacitor is also formed at the side surface of the insulated gate so that the gate-to-source parasitic capacitance can be further increased and the gate-to-source impedance can be further decreased.

In another embodiment of the semiconductor device disclosed in this specification, the portion which is to be the same potential with the source electrode is at least a part of the source electrode. The semiconductor device of this embodiment includes a capacitor configured with the insulated gate and the source electrode. The gate-to-source distance is the thickness of the insulated layer of the insulated gate so that the gate-to-source parasitic capacitance can be increased and the gate-to-source impedance can be decreased.

In another embodiment of the semiconductor device disclosed in this specification, the insulated gate may be a recess-type. The recess-type insulated gate may penetrate the second semiconductor layer and reach the first semiconductor layer. The semiconductor device including the recess-type insulated gate which reaches the first semiconductor layer can operate in normally-off.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Preferred embodiments of the present invention will now be described with reference to the accompanying drawings. Common constituent elements are designated by common reference numerals and will not again be described.

First Embodiment

As depicted in FIG. 1, a semiconductor device 1 is of a type called HEMT (High Electron Mobility Transistor) or HFET (Heterostructure Field Effect Transistor) and includes a semiconductor laminated body 10, a drain electrode 22, an insulated gate 25, and a source electrode 28. The semiconductor laminated body 10 has an electron transit layer 12, an electron supply layer 14, and a source region 16.

Non-doped gallium nitride (GaN) is used as a material of the electron transit layer 12. The electron transit layer 12 is formed on a base substrate not shown using metal organic chemical vapor deposition (MOCVD). Notably, the electron transit layer 12 is an example of a first semiconductor layer described in Claims.

The electron supply layer 14 is disposed on the electron transit layer 12 and non-doped aluminum gallium nitride (AlGaN) is used for the material of the electron supply layer 14. Preferably, the composition ratio of aluminum in the electron supply layer 14 is approximately 15 to 30% and the thickness thereof is approximately 20 to 30 nm. As an example, the aluminum composition ratio of the electron supply layer 14 is approx. 25% and the thickness thereof is approx. 25 nm. The electron supply layer 14 is formed on the electron transit layer 12 using the metal organic chemical vapor deposition. The bandgap of the electron supply layer 14 is greater than that of the electron transit layer 12. For this reason, two-dimensional electron gas (2DEG) is formed at the hetero junction between the electron transit layer 12 and the electron supply layer 14. When viewed from a direction orthogonal to the upper surface of the semiconductor laminated body 10 (hereinafter, referred to as "when viewed in plan"), a two-dimensional electron gas layer generated at the hetero junction between the electron transit layer 12 and the electron supply layer 14 extends between the drain electrode 22 and the insulated gate 25. The electron supply layer 14 is an example of a second semiconductor layer described in Claims.

The source region 16 is disposed in a part of a surface layer of the semiconductor laminated body 10 and silicon is introduced as an impurity into the source region 16 at a high density. The source region 16 may be formed, by introducing silicon into a part of the electron transit layer 12 and the electron supply layer 14 using an ion implantation technique. Alternatively, the source region 16 may be formed by forming a trench in a part of the surface layer of the semiconductor laminated body 10 and then by growing crystals of n-type gallium nitride (GaN) in the trench using the metal organic chemical vapor deposition.

The drain electrode 22 is disposed on the semiconductor laminated body 10 and is located apart from the source electrode 28 by a predetermined distance. The predetermined distance between the drain electrode 22 and the source electrode 28 is properly adjusted depending on a desired withstandvoltage. The material of the drain electrode 22 is preferably a material that is capable of having ohmic contact with a nitride based semiconductor material. As an example, a laminated electrode in which titanium (Ti) and aluminum (Al) are laminated, is used as the drain electrode 22. The drain electrode 22 is therefore configured to be capable of having ohmic contact with the two-dimensional electron gas layer formed at the hetero junction between the electron transit layer 12 and the electron supply layer 14. Ohmic properties of the drain electrode 22 are preferably improved by performing sintering treatment (600 degrees Centigrade, 5 minutes, as an example).

The insulated gate 25 is disposed on the semiconductor laminated body 10 and located between the drain electrode 22 and the source electrode 28. The insulated gate 25 has a gate insulator film 24 and a gate electrode 26. The gate electrode 26 faces the semiconductor laminated body 10 via the gate insulator film 24. As an example, the material of the gate insulator film 24 is silicon nitride (SiN), silicon oxide ($SiO_2$), or aluminum oxide ($Al_2O_3$), while the material of the gate electrode 26 is a laminated electrode formed of nickel (Ni) and aluminum (Al). The insulated gate 25 is disposed so as to partly overlap with the source region 16 when viewed in plan. In the overlapping portion, the gate electrode 26 and the source region 16 face each other via the gate insulator film 24. Consequently, the overlapping portion forms a capacitor.

The source electrode 28 is disposed on the semiconductor laminated body 10 and is in contact with the source region 16. The material of the source electrode 28 is preferably a material that is capable of having ohmic contact with a nitride based semiconductor material. As an example, a laminated electrode in which titanium (Ti) and aluminum (Al) are laminated, is used as the source electrode 28. The source electrode 28 is thus configured to be capable of having ohmic contact with the source region 16. Further, the ohmic properties of the source electrode 28 are preferably improved by performing sintering treatment (600 degrees Centigrade, 5 minutes, as an example).

Operations of the semiconductor device 1 will then be described. The semiconductor device 1 operates with a positive voltage applied to the drain electrode 22 and with a ground voltage applied to the source electrode 28. The two-dimensional electron gas layer on the hetero junction between the electron transit layer 12 and the electron supply layer 14 disappears under the insulated gate 25 when a negative voltage is applied to the gate electrode 26 of the insulated gate 25. As a result, an electric current path between the drain electrode 22 and source electrode 28 is interrupted at the hetero junction that the insulated gate 25 faces such that the semiconductor device 1 is turned off.

When ground voltage or positive voltage is applied to the gate electrode 26 of the insulated gate 25, a two-dimensional electron gas layer is generated at the hetero junction between the electron transit layer 12 and the electron supply layer 14 also under the insulated gate 25. Electrons injected from the source electrode 28 flow via the source region 16 and the two-dimensional electron gas layer into the drain electrode 22 such that the semiconductor device 1 is turned on.

Figure 2:
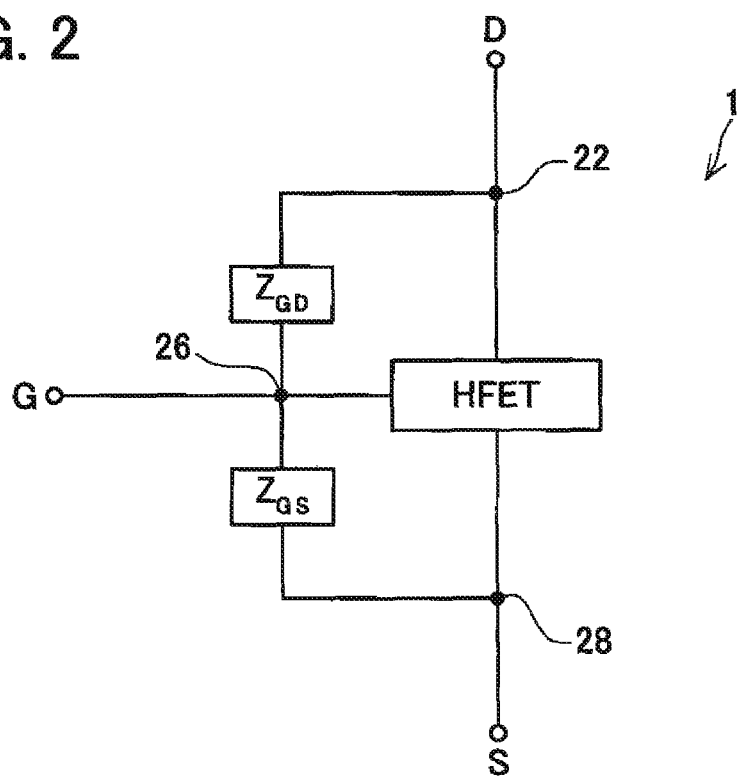
FIG. 2 depicts an equivalent circuit of the semiconductor device of the first embodiment.

Next, a case where an excessive noise voltage is applied to the drain electrode 22 when the semiconductor device 1 is off, is considered. As depicted in FIG. 2, the semiconductor device 1 includes an equivalent circuit in which a gate-to-drain impedance element and a gate-to-source impedance element are connected in series. The gate-to-drain impedance is denoted by $Z_{GD}$ and the gate-to-source impedance is denoted by $Z_{GS}$. When an excessive noise voltage $V_{DN}$ is input via a drain terminal to the drain electrode 22, the equivalent circuit acts as a voltage-dividing circuit and thus a voltage $V_{GN}$ of the gate electrode 26 at the middle point between the impedance elements connected in series is increased based on a voltage-division ratio determined by the gate-to-drain impedance $Z_{GD}$ and the gate-to-source impedance $Z_{GS}$ as represented by the following equation:

$$V_{GN} = V_{DN} \times \frac{Z_{GS}}{Z_{GD} + Z_{GS}}$$

Figure 3:
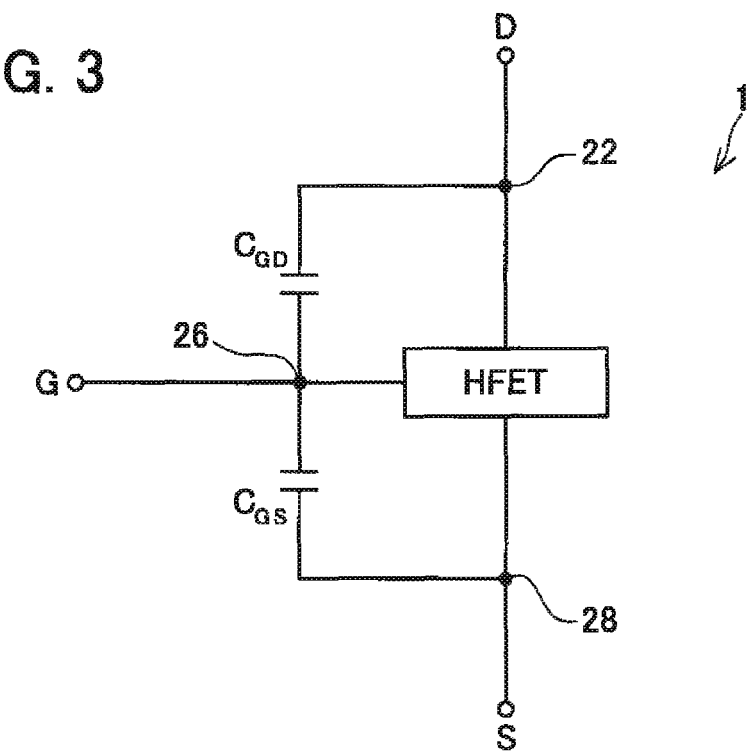
FIG. 3 depicts another equivalent circuit of the semiconductor device of the first embodiment.

Since the voltage increase of the gate electrode 26 causes a malfunction (called self turn-on), it is preferred to suppress the voltage increase to be low. As is apparent from the above equation, the gate-to-source impedance $Z_{GS}$ is preferably relatively smaller than the gate-to-drain impedance $Z_{GD}$ in order to suppress the voltage rise of the gate electrode 26. Herein, the gate-to-drain impedance $Z_{GD}$ depends strongly on a gate-to-drain parasitic capacitance while the gate-to-source impedance $Z_{GS}$ depends strongly on a gate-to-source parasitic capacitance. Accordingly, as depicted in FIG. 3, it is preferred that the gate-to-source parasitic capacitance $C_{GS}$ be relatively greater than the gate-to-drain parasitic capacitance $C_{GD}$ in order to suppress the voltage rise of the gate electrode 26.

In the semiconductor device 1, as depicted in FIG. 1, the source region 16 and the gate electrode 26 face each other via the gate insulator film 24 so that this portion forms a capacitor. Since the source region 16 is electrically connected to the source electrode 28, the source region 16 is fixed to the same potential as the source electrode 28. For this reason, the gate-to-source parasitic capacitance $C_{GS}$ includes the capacitance of the capacitor. The capacitance of the capacitor depends on the material and the thickness of the gate insulator film and further on a facing area of the source region 16 and the gate electrode 26. In particular, the thickness of the gate insulator film is extremely thin such that the capacitor has a very large capacitance. Thus, the gate-to-source parasitic capacitance $C_{GS}$ depends substantially on the capacitance of the capacitor. In other words, the gate-to-source parasitic capacitance $C_{GS}$ is less influenced by an effect of the parasitic capacitance, which is brought forth by a depletion layer between gate and source. Since the capacitor has a very large capacitance as described above, a relationship is obtained where the gate-to-source parasitic capacitance $C_{GS}$ is relatively greater than the gate-to-drain parasitic capacitance $C_{GD}$. As a result, in the semiconductor device 1, the gate-tosource impedance $Z_{GS}$ becomes relatively smaller than the gate-to-drain impedance $Z_{GD}$) so that the voltage rise can be suppressed at the gate electrode 26, thereby suppressing the malfunction.

The semiconductor device 1 particularly enables the gate-to-source parasitic capacitance $C_{GS}$ to be set to a desired value by adjusting the facing area of the source region 16 and the gate electrode 26. The facing area of the source region 16 and the gate electrode 26 does not affect the withstandvoltage of the semiconductor device 1. In this manner, the semiconductor device 1 can have resistance to noise without sacrificing the withstandvoltage.

Figure 4:
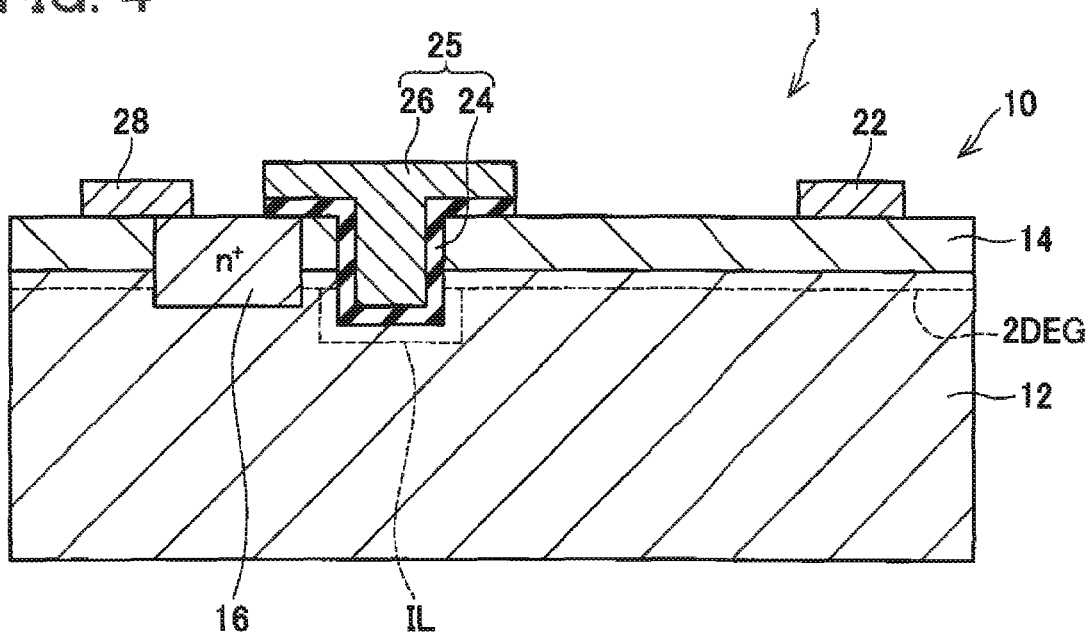
FIG. 4 is a schematic sectional view of an essential part of a variant of the semiconductor device according to the first embodiment.

As depicted in FIG. 4, the insulated gate 25 of the semiconductor device 1 may be of a recess type. This insulated gate 25 penetrates the electron supply layer 14 and reaches the electron transit layer 12. This variant of the semiconductor device 1 provides on/off control using an inversion layer IL generated at a bottom of the recessed insulated gate 25. The semiconductor device 1 turns on when positive voltage is applied to the gate electrode 26 and turns off when ground voltage is applied to the gate electrode 26. In other words, the semiconductor device 1 can operate in normally-off.

Figure 5:
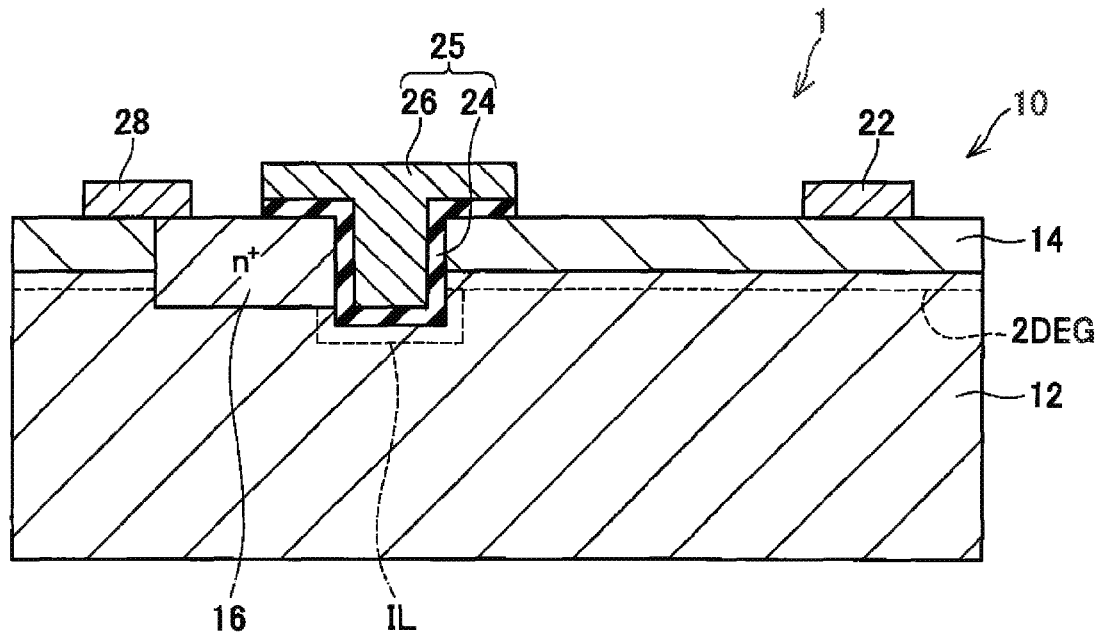
FIG. 5 is a schematic sectional view of an essential part of another variant of the semiconductor device according to the first embodiment.

As depicted in FIG. 5, a variant of the semiconductor device 1 may have the source region 16 in contact with a side surface of the insulated gate 25. In this example, since a capacitor is formed on the side surface of the insulated gate 25 as well, the gate-to-source parasitic capacitance $C_{GS}$ becomes greater. Alternatively, the semiconductor device 1 can be miniaturized if the same gate-to-source parasitic capacitance $C_{GS}$ is secured.

Second Embodiment

Figure 6:
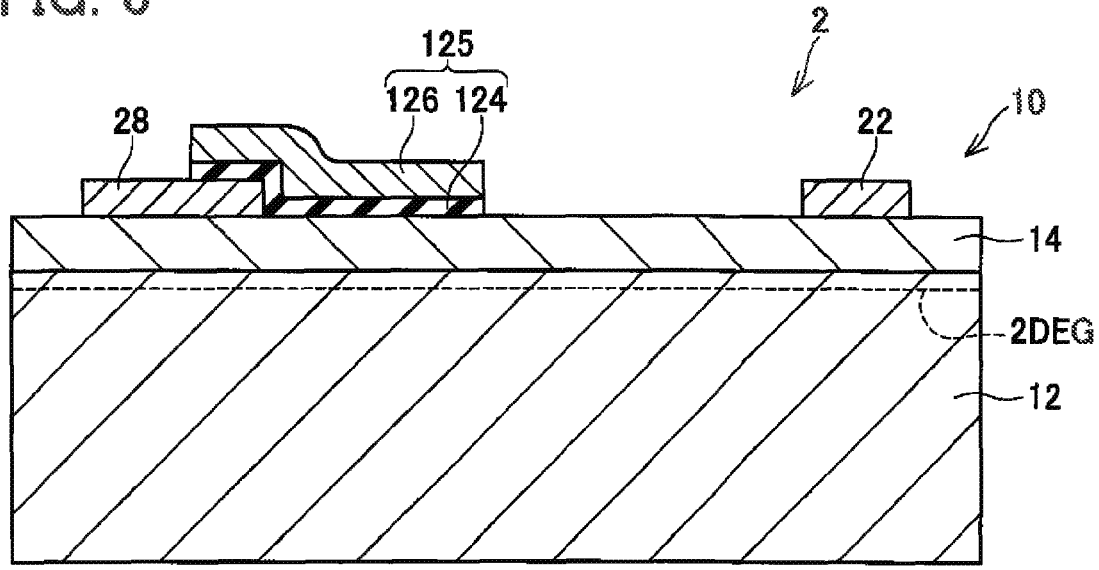
FIG. 6 is a schematic sectional view of an essential part of a semiconductor device according to a second embodiment.

As depicted in FIG. 6, a semiconductor device 2 is characterized in that it includes an insulated gate 125 extending onto a source electrode 28. The insulated gate 125 is disposed so as to partly overlap with the source electrode 28 when viewed in plan. In the overlapping portion, a gate electrode 126 and the source electrode 28 face each other via a gate insulator film 124. Consequently, the overlapping portion forms a capacitor.

Since the semiconductor device 2 has a large capacitor capacitance as well, a relationship can be obtained where a gate-to-source parasitic capacitance $C_{GS}$ is relatively greater than a gate-to-drain parasitic capacitance $C_{GD}$. As a result, the semiconductor device 2 also has a gate-to-source impedance $Z_{GS}$ be relatively smaller than a gate-to-drain impedance $Z_{GD}$ so that the voltage increase is suppressed at the gate electrode 126, thereby suppressing the malfunction.

Figure 7:
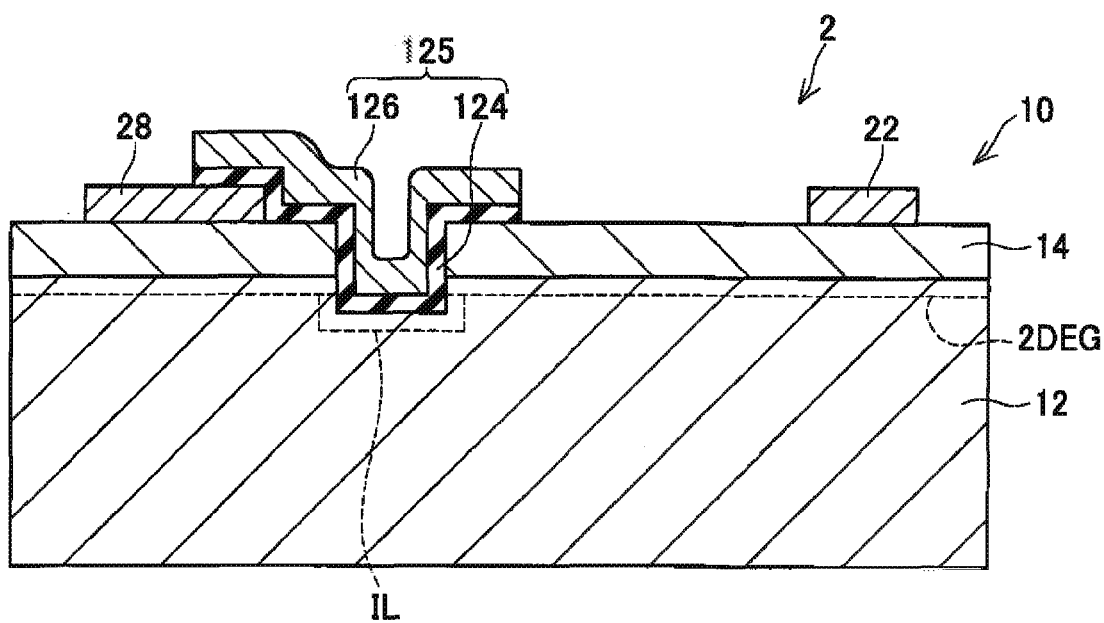
FIG. 7 is a schematic sectional view of an essential part of a variant of the semiconductor device according to the second embodiment.

As depicted in FIG. 7, the insulated gate 125 of the semiconductor device 2 may be of a recess type. This insulated gate 125 penetrates an electron supply layer 14 and reaches an electron transit layer 12. This variant of the semiconductor device 2 provides on/off control using an inversion layer IT generated at a bottom of the recessed insulated gate 125. The semiconductor device 2 turns on when positive voltage is applied to the gate electrode 126 and turns off when ground voltage is applied to the gate electrode 126. In other words, the semiconductor device 2 can operate in normally-off.

What is claimed is:

1. A semiconductor device comprising:
a semiconductor laminated body;
a drain electrode disposed on the semiconductor laminated body;
a source electrode disposed on the semiconductor laminated body and located apart from the drain electrode; and
an insulated gate disposed on the semiconductor laminated body and located between the drain electrode and the source electrode,
wherein
the semiconductor laminated body includes:
a first semiconductor layer; and
a second semiconductor layer disposed on the first semiconductor layer and having a bandgap which is different from a bandgap of the first semiconductor layer,
in a region between the drain electrode and the insulated gate, a two-dimensional electron gas layer is configured to be generated at a hetero junction between the first semiconductor layer and the second semiconductor layer,
a part of the insulated gate is configured to face a portion which is to be a same potential with the source electrode,
the source electrode is disposed on an upper surface of the second semiconductor layer, and
the portion which is to be the same potential with the source electrode is at least a part of the source electrode.

2. The semiconductor device according to claim 1, wherein the insulated gate is of a recess-type that penetrates the second semiconductor layer and reaches the first semiconductor layer.

3. The semiconductor device according to claim 1, wherein the source electrode is in ohmic contact with the upper surface of the second semiconductor layer.

* * * * *